US010653040B1

(12) United States Patent
Wang et al.

(10) Patent No.: US 10,653,040 B1
(45) Date of Patent: May 12, 2020

(54) APPARATUS FOR CHANGING AIRFLOW IN A SERVER

(71) Applicant: QUANTA COMPUTER INC., Taoyuan (TW)

(72) Inventors: Wei-Te Wang, Taoyuan (TW); Shuo-Ting Jian, Taoyuan (TW); Samuel Chatelier, Taoyuan (TW); Yi-Chieh Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/418,331

(22) Filed: May 21, 2019

(51) Int. Cl.
 *H05K 7/20* (2006.01)
(52) U.S. Cl.
 CPC ..... *H05K 7/20736* (2013.01); *H05K 7/20145* (2013.01)
(58) Field of Classification Search
 CPC ....... G06F 1/20; G06F 1/181; H05K 7/20736; H05K 7/20727; H05K 7/20836; H05K 7/20745; H05K 7/20145; H05K 7/1487; H05K 7/1492; H05K 7/20172; H05K 7/20718; H05K 7/1489; H05K 7/18; H05K 7/20136; H05K 7/1488
 See application file for complete search history.

(56) References Cited

U.S. PATENT DOCUMENTS

| | | |
|---|---|---|
| 7,262,964 B1 | 8/2007 | Barsun |
| 7,269,006 B2 * | 9/2007 | Miyamoto ............. G11B 33/12 312/236 |
| 8,767,399 B2 * | 7/2014 | Goto ................. H05K 7/20209 361/679.51 |
| 8,811,009 B2 | 8/2014 | Chen |
| 10,334,753 B2 * | 6/2019 | Chu .......................... G06F 1/20 |
| 2004/0174687 A1 * | 9/2004 | Wang ..................... G06F 1/184 361/801 |
| 2004/0252456 A1 * | 12/2004 | Larson ..................... G06F 1/20 361/694 |
| 2005/0162831 A1 | 7/2005 | Shum et al. |
| 2008/0151490 A1 * | 6/2008 | Fan .......................... G06F 1/20 361/679.47 |
| 2009/0021912 A1 * | 1/2009 | Yin ......................... G06F 1/20 361/695 |
| 2009/0034190 A1 * | 2/2009 | Tsai ......................... G06F 1/20 361/695 |

(Continued)

FOREIGN PATENT DOCUMENTS

JP 2014183079 A 9/2014

OTHER PUBLICATIONS

Extended European Search Report for EP Application No. 19194931.2, dated Mar. 9, 2020.

*Primary Examiner* — Adam B Dravininkas
(74) *Attorney, Agent, or Firm* — Nixon Peabody LLP; Zhou Lu

(57) ABSTRACT

The present disclosure is directed to an apparatus for a server chassis. A position of the apparatus changes the airflow in the server chassis. The apparatus can be adjacent to a slot in the server chassis. The apparatus adjusts among a plurality of positions based on a height of the slot and/or a size of a computer component received at the slot. The apparatus includes a base portion and an arm. The base portion can couple with a wall of the chassis body, and the arm can include a plurality of moveable segments.

16 Claims, 5 Drawing Sheets

(56) References Cited

U.S. PATENT DOCUMENTS

| | | | |
|---|---|---|---|
| 2010/0165568 A1* | 7/2010 | Tsai | G06F 1/20 361/679.49 |
| 2011/0103005 A1* | 5/2011 | Neumann | G06F 1/181 361/679.46 |
| 2013/0148290 A1* | 6/2013 | Chen | G06F 1/20 361/679.46 |
| 2013/0155612 A1* | 6/2013 | Korikawa | H05K 7/20145 361/692 |
| 2019/0116688 A1* | 4/2019 | Chu | G06F 1/20 |
| 2019/0387646 A1* | 12/2019 | Yang | H05K 7/20745 |

* cited by examiner

APPARATUS FOR CHANGING AIRFLOW IN A SERVER

FIELD

The present disclosure relates to a movable apparatus for changing the air flow in a server.

BACKGROUND

Modern computing systems comprise numerous computer components such as GPUs, CPUs, RAM, etc. As computer components become faster and more powerful (e.g., with smaller form factors and faster GPUs or CPUs), more heat is generated within the computer components. Without adequate cooling, overheating may occur, causing physical damage to the components; overheating can even lead to system failures and data loss.

Conventional computer chassis provide slots to hold the computer components; the slots are typically adjacent to cooling fans so that the fans can direct airflow to the computer components. When a slot receives a computer component that fills up the entire slot, the air flow is properly directed to the computer component. However, when a slot receives a computer component that is smaller than the slot, the airflow is redirected into the empty space between the computer component and the edge of the slot. Consequently, the airflow does not maximally cool the computer component because a portion of the airflow flows towards the empty space instead of towards the component.

The problem can be exacerbated when a chassis has a plurality of slots in a row with cooling fans common to all the slots. Then airflow is redirected towards empty space where there is no computer component, instead of flowing over the computer components.

Therefore, systems are needed to promote efficient cooling of computer components.

SUMMARY

The various examples of the present disclosure are directed towards an apparatus for changing airflow in a server. A first embodiment of the present disclosure provides an apparatus with a base portion and an arm. The base portion can couple with a wall of the server. The arm can correspond to a slot in the server, and can be located adjacent to a first edge of the slot. The arm can adjust among a plurality of positions based on a height of the slot and/or a computer component received at the slot.

In some examples of the first embodiment, the arm includes a plurality of bendable segments. Each segment bends at any angle, and bends independently from the other segments.

In some examples, the plurality of positions includes a resting position. In the resting position, the arm extends away from the base portion and the first edge until an end segment of the arm abuts a second edge of the slot (the second edge being opposite the first edge). The arm adjusts to the resting position when no computer component is received in the slot.

In some examples, the plurality of positions includes a partially-extended position. In the partially-extended position, the arm extends away from the base portion and the first edge until an end segment of the arm abuts a computer component of a first size housed within the slot. The arm adjusts to the partially-extended position when the slot receives the computer component of a first size. In some examples of the partially-extended position, the end segment lies adjacent to the computer component.

In some examples, the plurality of positions includes a fully-extended position, where the arm lies adjacent to the first edge of the slot. The arm adjusts to the fully-extended position when the slot receives a computer component of a second size.

A second embodiment of the present disclosure provides a server with a chassis body, a plurality of slots, and an apparatus. Each slot in the plurality of slots can receive at least one computer component. The apparatus can be housed in the chassis body, and can control airflow through the chassis body. The apparatus can have a base portion and a plurality of arms. The base portion can couple with a wall of the chassis body. Each arm in the plurality of arms can correspond to a slot in the plurality of slots, and can be adjacent to a first edge of a corresponding slot. Each arm can adjust among a plurality of positions based on a height of the corresponding slot and/or a computer component received at the corresponding slot. Additional examples of the second embodiment can be as described above with respect to the first embodiment.

A third embodiment of the present disclosure provides an apparatus for controlling airflow through a chassis body. The apparatus can be housed in the chassis body, and can control airflow through the chassis body. The apparatus can have a base portion and a plurality of arms. The base portion can couple with a wall of the chassis body. Each arm in the plurality of arms can correspond to a slot in the plurality of slots, and can be adjacent to a first edge of a corresponding slot. Each arm can adjust among a plurality of positions based on a height of the corresponding slot and/or a computer component received at the corresponding slot. Additional examples of the third embodiment can be as described above with respect to the first embodiment.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1:
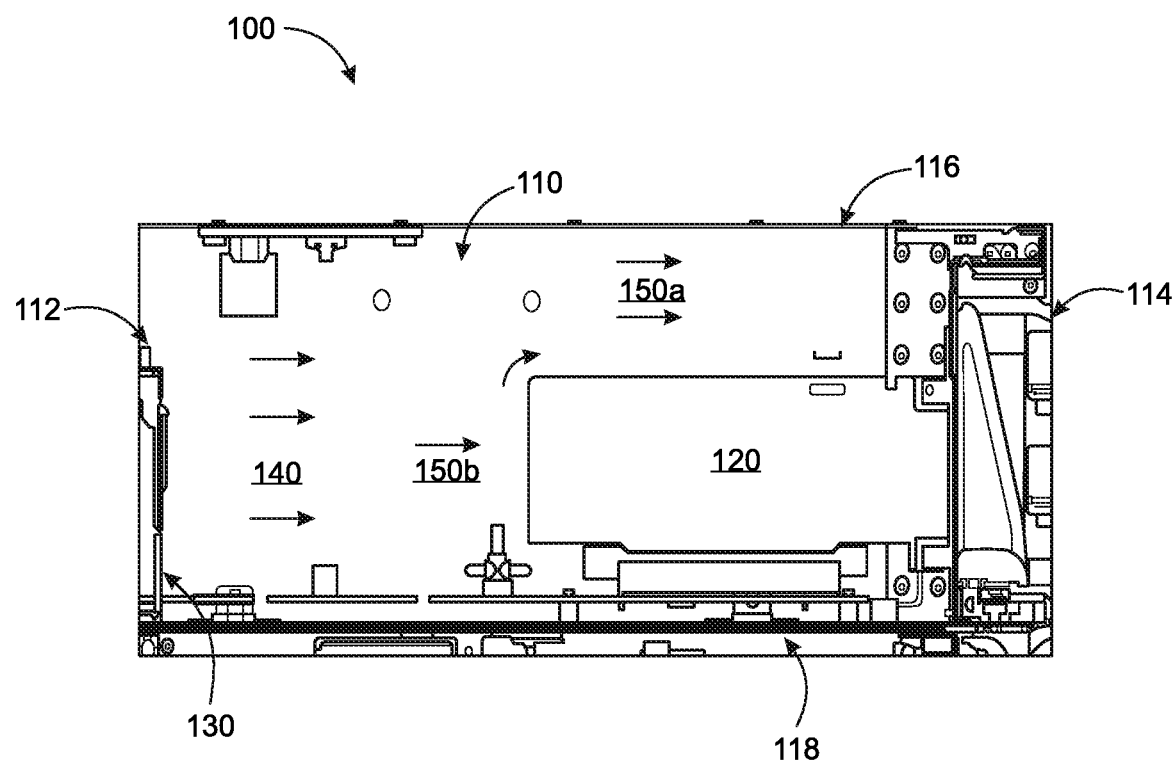
FIG. 1 shows a conventional computer component slot in a chassis, as in the prior art.

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure is directed to an exemplary apparatus for a server chassis. A position of the apparatus changes the airflow in the server chassis. The apparatus can be adjacent to a slot in the server chassis. The apparatus adjusts among a plurality of positions based on a height of the slot and/or a size of a computer component received at the slot. The apparatus includes a base portion and an arm. The base portion can couple with a wall of the chassis body, and the arm can include a plurality of moveable segments. The plurality of moveable segments configures the arm to direct airflow over the computer component received in the slot; therefore, the apparatus reduces airflow leakage between an edge of the computer component and an edge of the slot.

FIG. 1 shows a conventional chassis 100, according to the prior art. Chassis 100 includes a card slot 110 with a front edge 112, a rear edge 114, a top edge 116, and a bottom edge 118; a computer component 120; an iron frame 130; airflow 140; and airflow splits 150a and 150b.

The card slot 110 receives a computer component 120. Although computer component 120 is shown to have a particular size in FIG. 1, any computer component can be received by conventional chassis 100 so long as the computer component has a width less than a distance between a top edge 116 and a bottom edge 118 of the slot 110. FIG. 1 shows that when slot 110 receives computer component 120, there is empty space between the computer component 120 and the top edge 116 of the slot 110. An iron frame 130 directs airflow 140 from a front edge 112 of the slot 110 towards the computer component 120 and a rear edge 114 of the slot 110. FIG. 1 demonstrates that the airflow 140 splits into a top portion 150a and a bottom portion 150b; the majority of the airflow 150a exits the slot 110 in the empty space between the computer component 110 and the top edge 116 of the slot 110. This top portion 150a of the airflow does not contribute to cooling of the computer component 120. Therefore, a large portion of the airflow 140 directed into the slot 110 by iron frame 130 is wasted.

Figure 2A:
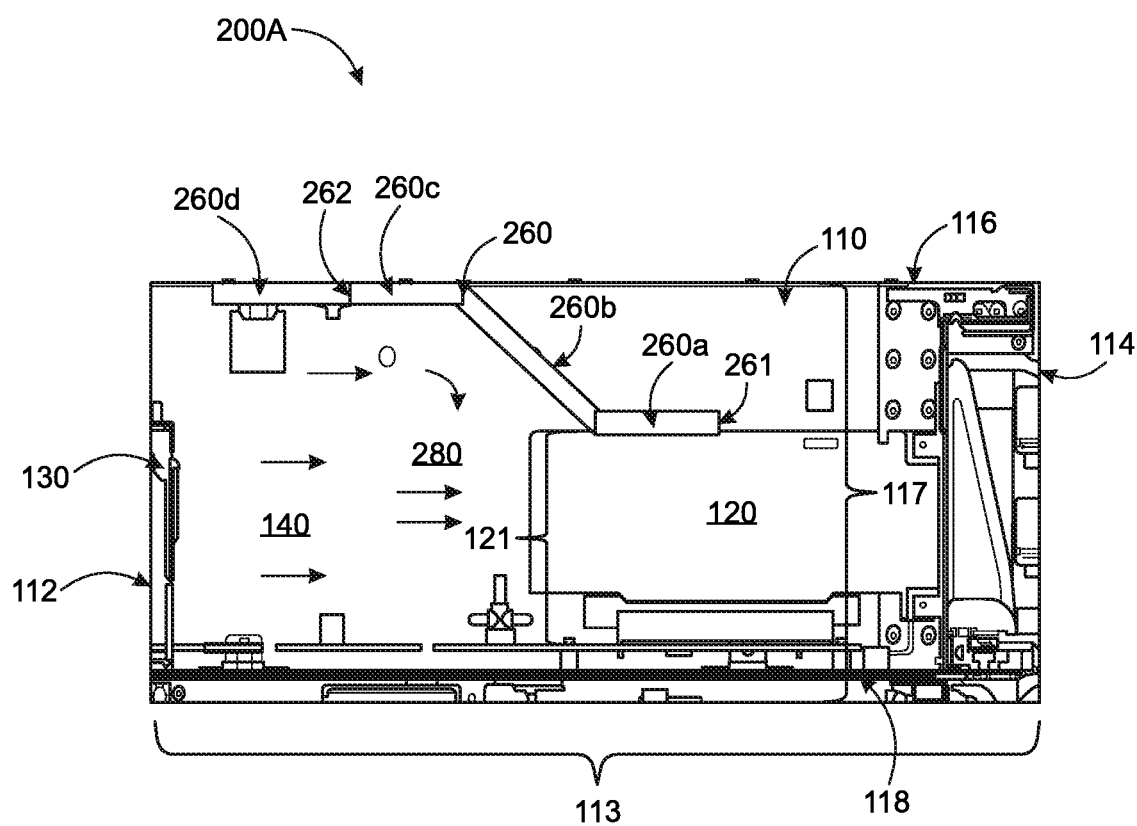
FIG. 2A shows an exemplary apparatus for changing the air flow in a computer component slot, according to an embodiment of the present disclosure.

In response to the limitations of the prior art, the present disclosure provides an apparatus to direct the airflow in a server chassis. FIG. 2A shows an exemplary chassis 200A with such an apparatus, according to an embodiment of the present disclosure. Chassis 200A includes similar components and labels as chassis 100 of FIG. 1. In addition, chassis 200A includes an apparatus 260 with a plurality of segments 260a, 260b, 260c, and 260d; and redirected airflow 280.

An apparatus 260 can have a plurality of segments 260a, 260b, 260c, and 260d. Segment 260d can be a base portion coupling the apparatus 260 to the top edge 116 of the chassis 200A. For example, segment 260d can be fastened to the top edge 116 permanently or removably by Velco™, glue, screws, male and female connectors, tape, and/or any other mechanical connector as contemplated by one skilled in the art. The remaining segments 260a, 260b, and 260c can be an arm of the apparatus 260. The apparatus 260 can have a length shorter than a distance 113 between a front edge 112 and a rear edge 114 of the slot 110. The apparatus 260 can have a length equal to or greater than a distance 117 between a top edge 116 and a bottom edge 118 of the slot 110. Although four segments 260a, 260b, 260c, and 260d are shown in FIG. 2A, and apparatus 260 can have any number of segments so long as there are at least two—one segment for the base portion and one segment for the arm portion.

All segments 260a, 260b, 260c, and 260d can bend with respect to each other, and can bend independently of each other. For example, the segments 260a, 260b, 260c, and 260d can be jointed, pivotable, or bendable. In some examples, the apparatus 260 can be made of a material that is elastic, flexible, bendable, or has shape memory properties. In addition, each segment 260a, 260b, 260c, 260d can bend at any angle.

FIG. 2A shows the apparatus 260 in a partially-extended position. In the partially-extended position, the arm portion (segments 260a, 260b, and 260c) extends away from the base portion 260d until a segment 260a abuts with computer component 120 at a height 121 of the computer component 120. Therefore, apparatus 260 forms a barrier between: (1) the iron frame 130; and (2) the empty space between the computer component 120 and a top edge 116 of the slot 110. Segment 260a can lay flush against computer component 120. Therefore, the airflow 140 directed by iron frame 130 is redirected straight towards computer component 120 (shown by arrows 280).

FIG. 2A shows a partially-extended position where segment 260a is flush against computer component 120, and segment 260c is flush against the top edge 116 of the slot 110. In some examples of the partially-extended position, only a tip 261 of segment 260a can be adjacent to computer component 120, and only a tip 262 of segment 260 can be adjacent to a top edge 116 of the slot 110 (for example, such a position is shown by element 380b in FIG. 3B).

In some examples (shown further by element 380a in FIG. 3B), the apparatus 260 can be in a resting position where segment 260a abuts a bottom edge 118 of the slot 110. For example, apparatus 260 can be in a resting position until the slot 110 receives a computer component, such as computer component 120. When the slot 110 receives computer component 120, the apparatus 260 can shift to the partially-extended position as shown in FIG. 2A. For example, a user can move apparatus 260 between positions.

Altogether, FIG. 2A demonstrates that the apparatus 260 can redirect airflow (arrows 280) such that no airflow 140 is wasted. Therefore, apparatus 260 ensures more efficient cooling of computer component 120 (or any component when loaded in slot 110).

Figure 2B:
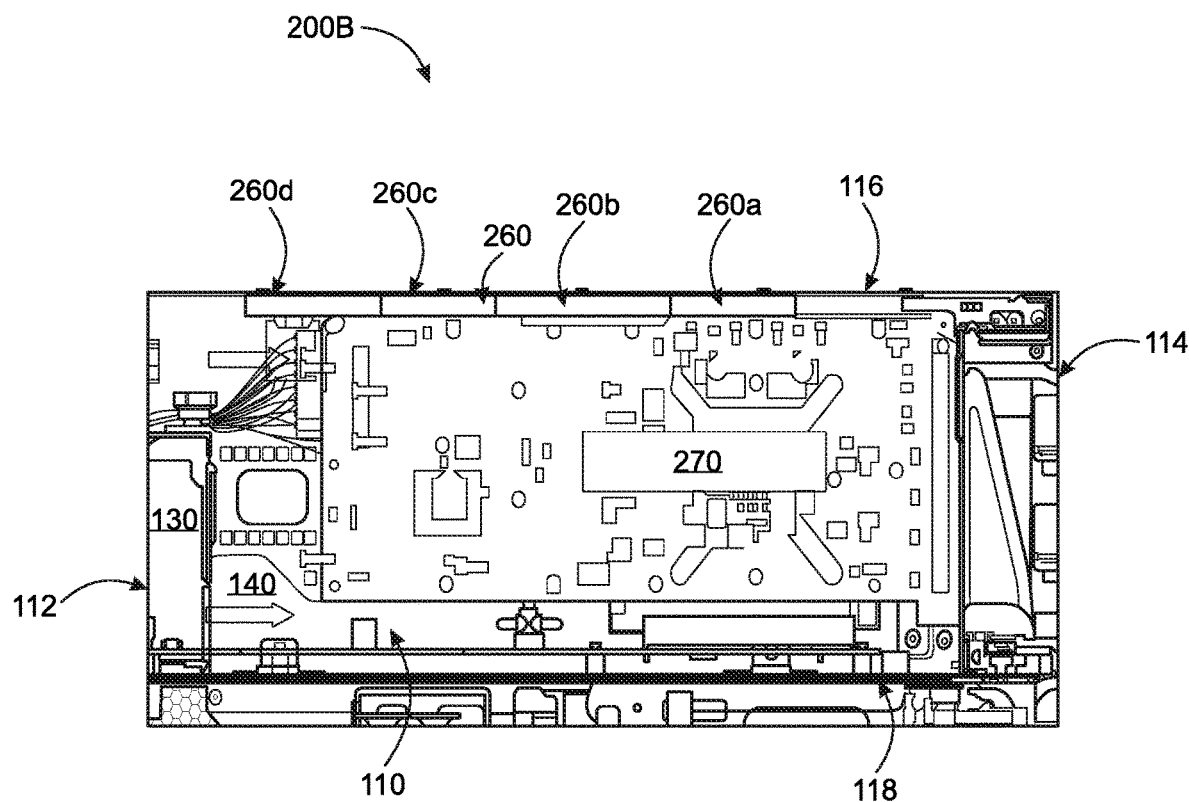
FIG. 2B shows another position of the exemplary apparatus shown in FIG. 2A, according to an embodiment of the present disclosure.

FIG. 2B shows an exemplary chassis 200B, in accordance with another embodiment of the present disclosure. Chassis 200B includes similar components and labels as chassis 200A of FIG. 2A. In addition, chassis 200B includes a computer component of a second size 270.

FIG. 2B demonstrates a fully-extended position of the apparatus 260. Because the computer component 270 substantially fills the entire slot 110 without an empty space between the computer component 270 and edges 116 and 118 of the slot, the apparatus 260 does not need to redirect airflow. Therefore, apparatus 260 can move into a fully-extended position where all segments 260a, 260b, 260c, and 260d lie adjacent to the computer component 270 and a top edge 116 of the slot 110.

Although FIGS. 2A-2B show an apparatus 260 with three positions (a resting position, a partially-extended position, and a fully-extended position), the apparatus 260 can have any number of positions. The apparatus 260 can move between positions according to a size of a computer component and a size of the slot 110. In some examples, the partially-extended position of the apparatus 260 can be at any height, according to a height of a computer component that is received by the slot.

In some examples of the present disclosure, apparatus 260 can be biased towards a particular position. For example, apparatus 260 can be made of shape memory material, which biases the apparatus 260 towards the resting position.

Figure 3A:
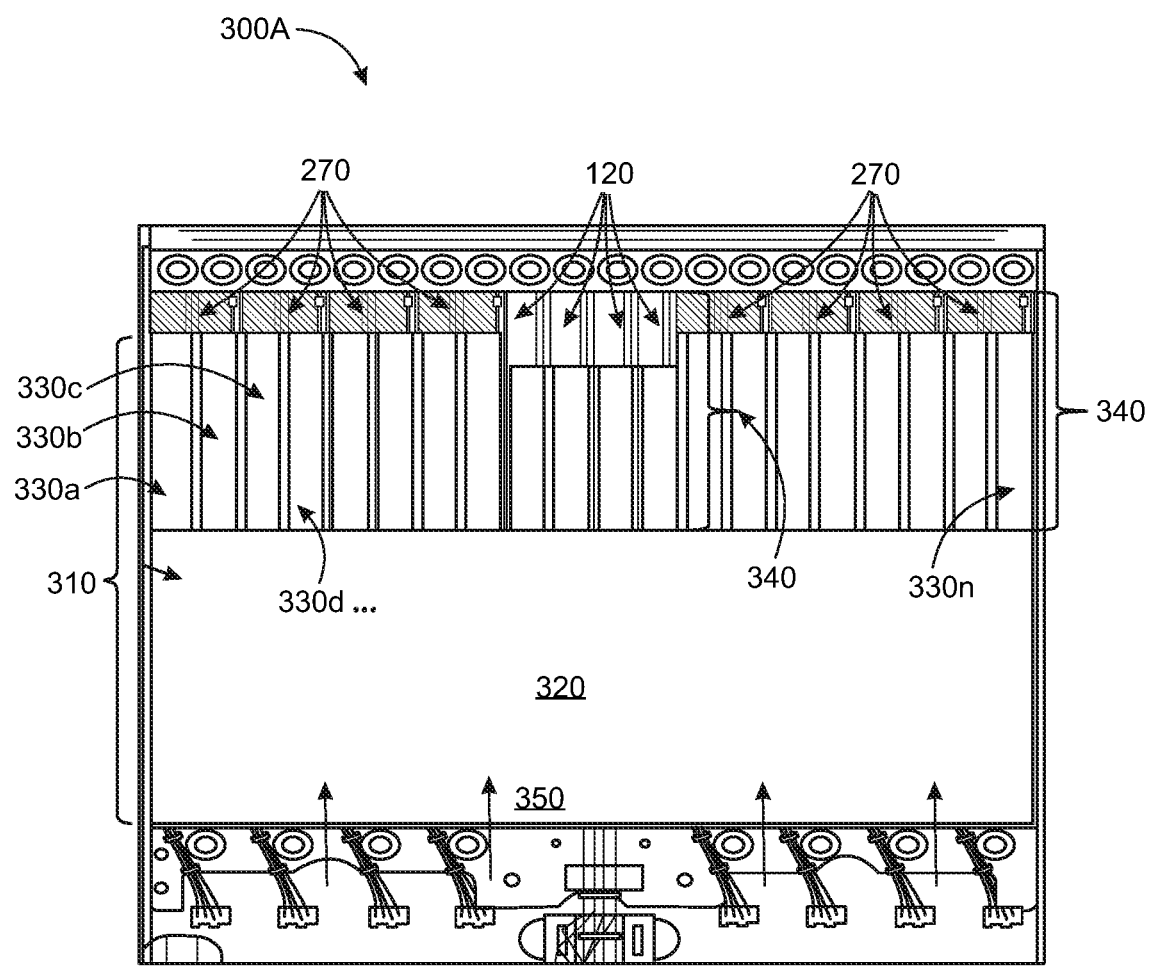
FIG. 3A shows an exemplary apparatus for changing the airflow in a server chassis comprising a plurality of slots, according to an embodiment of the present disclosure.

FIG. 3A shows an exemplary chassis 300A, according to an embodiment of the present disclosure. Chassis 300A includes computer components of a first size 120; computer components of a second size 270; an air duct 310 with a base 320 and a plurality of arms 330a, 330b, 330c, 330d, . . . 330n; slots 340; and airflow 350.

Chassis 300A provides an air duct 310, which extends across a plurality of slots 340 to direct airflow within each slot 340. Each slot 340 receives a computer component (e.g. either computer component 120 or 270). Although each slot 340 is shown receiving one computer component, in some examples, slots 340 can receive any number of computer components. The air duct 310 has a base portion 320 and a plurality of arms 330a, 330b, 330c, 330d, . . . 330n. Each arm 330a, 330b, 330c, 330d, . . . 330n corresponds to one computer component 120 or 270. Each slot 340 has one corresponding arm 330a, 330b, 330c, 330d, . . . 330n.

Each arm 330a, 330b, 330c, 330d, . . . 330n can be as provided for above with respect to apparatus 260 of FIGS. 2A-2B. For example, each arm 330a, 330b, 330c, 330d, . . . 330n can have a plurality of bendable segments. FIG. 3A shows that each arm 330a, 330b, 330c, 330d, . . . 330n can adjust independently from the remaining arms based on what computer component is received in its corresponding slot 340. For example, arms corresponding to slots holding computer components 120 can be in a partially-extended position (as shown in FIG. 2A). Arms corresponding to slots holding computer components 270 can be in a fully-extended position (as shown in FIG. 2B).

Figure 3B:
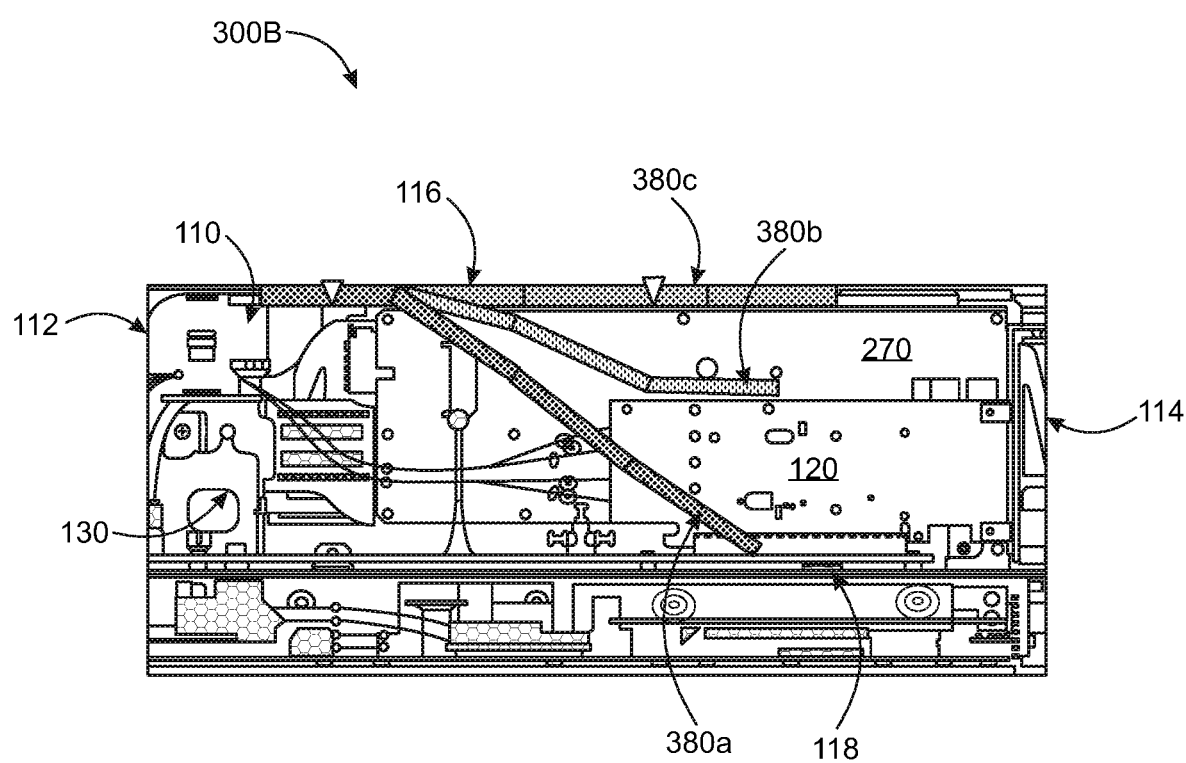
FIG. 3B shows a side-view of the exemplary apparatus of FIG. 3A, according to an embodiment of the present disclosure.

FIG. 3B shows a side view of an exemplary chassis 300B, according to an embodiment of the present disclosure. Chassis 300B includes similar components and labels as chassis 100 of FIG. 1 and chassis 300A of FIG. 3A. In addition, chassis 300B includes a first arm in a resting position 380a, a second arm in a partially-extended position 380b, and a third arm in a fully-extended position 380c. FIG. 3B demonstrates how different computer components 120 and 270 have arms in different positions 380a, 380b, and 380c, corresponding to a size of the computer component. For example, arm 380a corresponds to a slot 110 where no computer component is received; arm 380b corresponds to computer component 120; and arm 380c corresponds to computer component 270. Additionally, each arm 380a, 380b, and 380c can be in a position according to a size of the received computer component. Accordingly, FIG. 3B shows arm 380a in a resting position because no computer component is received; arm 380b is in a partially-extended position after receiving component 120; and arm 380c is in a fully-extended position after receiving component 270. Each arm 380a, 380b, and 380c can additionally shift to a different configuration if a differently-sized computer component is received.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An apparatus for changing an airflow in a server, comprising:
   a base portion having a length configured to be removably fastened to a wall of the server by a connector mechanism; and
   an arm corresponding to a slot in the server, the arm located adjacent to a first edge of the slot, the arm comprising a plurality of bendable segments, one of the plurality of segments being bendably attached to the base portion, each segment in the plurality of segments configured to bend independently from remaining segments in the plurality of segments,
   wherein the arm is configured to adjust among a plurality of positions based on a height of the slot and/or a computer component received in the slot.

2. The apparatus of claim 1, wherein the plurality of positions comprises a resting position, where the arm extends away from the first edge until an end segment of the arm abuts a second edge of the slot, the second edge of the slot being opposite the first edge, and wherein the at least one arm transitions to the resting position when no computer component is received in the slot.

3. The apparatus of claim 1, wherein the plurality of positions comprises a partially-extended position where the arm extends away from the first edge until an end segment of the arm abuts a computer component of a first size housed within the slot, and wherein the arm transitions to the partially-extended position when the slot receives the computer component of a first size.

4. The apparatus of claim 3, wherein the end segment lies adjacent to the computer component.

5. The apparatus of claim 1, wherein the plurality of positions comprises a fully-extended position where the arm lies adjacent to the first edge of the slot, and wherein the at least one arm transitions to the fully-extended position when the slot receives a computer component of a second size.

6. The apparatus of claim 1, wherein the connector mechanism is one of the group of Velcro™, screws, male/female connectors, or tape.

7. A server, comprising:
  a chassis body;
  a plurality of slots, wherein each slot in the plurality of slots is configured to receive at least one computer component;
  an apparatus, housed in the chassis body, for controlling airflow through the chassis body, the apparatus comprising:
    a base portion having a length configured to be removably fastened to a wall of the server by a connector mechanism;
    a plurality of arms, wherein each arm in the plurality of arms corresponds to a slot in the plurality of slots and is located adjacent to a first edge of a corresponding slot, wherein each arm comprises a plurality of bendable segments, one of the plurality of segments being bendably attached to the base portion, each segment in the plurality of segments configured to bend independently from remaining segments in the plurality of segments, and wherein each arm is configured to adjust among a plurality of positions based on a height of the corresponding slot and/or a computer component received in the corresponding slot.

8. The server of claim 7, wherein the plurality of positions comprises a resting position, wherein when an arm in the plurality of arms is in the resting position, the arm extends away from the first edge until an end segment of the arm abuts a second edge of the corresponding slot, the second edge being opposite the first edge, and wherein the arm transitions to the resting position when no computer component is received in the corresponding slot.

9. The server of claim 7, wherein the plurality of positions comprises a partially-extended position, wherein when an arm in the plurality of arms is in the partially-extended position, the arm extends away from the first edge until an end segment of the arm abuts a computer component of a first size housed within the corresponding slot, and wherein the arm transitions to the partially-extended position when the corresponding slot receives a computer component of a first size.

10. The server of claim 9, wherein the end segment lies adjacent to the computer component.

11. The server of claim 7, wherein the plurality of positions comprises a fully-extended position, wherein when an arm in the plurality of arms is in the fully-extended position, the arm lies adjacent to the first edge of the corresponding slot, and wherein the arm transitions to the fully-extended position when the corresponding slot receives a computer component of a second size.

12. An apparatus for controlling airflow through a chassis body, the apparatus comprising:
  a base portion having a length configured to be removably fastened to a wall of the server by a connector mechanism;
  a plurality of arms, wherein each arm in the plurality of arms corresponds to a slot in the chassis body, wherein each arm comprises a plurality of bendable segments, one of the plurality of segments being bendably attached to the base portion, each segment in the plurality of segments configured to bend independently from remaining segments in the plurality of segments, and wherein each arm is located adjacent to a first edge of the corresponding slot, and wherein each arm is configured to adjust among a plurality of positions, based on a height of the corresponding slot and/or a computer component received at the corresponding slot.

13. The apparatus of claim 12, wherein the plurality of positions comprises a resting position, wherein when an arm in the plurality of arms is in the resting position, the arm extends away from the first edge until an end segment of the arm abuts a second edge of the corresponding slot, the second edge being opposite the first edge, and wherein the arm transitions to the resting position when no computer component is received in the corresponding slot.

14. The apparatus of claim 12, wherein the plurality of positions comprises a partially-extended position, wherein when an arm in the plurality of arms is in the partially-extended position, the arm extends away from the first edge until an end segment of the arm abuts a computer component of a first size housed within the corresponding slot, and wherein the arm transitions to the partially-extended position when the corresponding slot receives a computer component of a first size.

15. The apparatus of claim 14, wherein the end segment lies adjacent to the computer component.

16. The apparatus of claim 14, wherein the plurality of positions comprises a fully-extended position, wherein when an arm in the plurality of arms is in the fully-extended position, the arm lies adjacent to the first edge of the corresponding slot, and wherein the arm transitions to the fully-extended position when the corresponding slot receives a computer component of a second size.

* * * * *